United States Patent
Kung et al.

(10) Patent No.: US 11,935,841 B2
(45) Date of Patent: Mar. 19, 2024

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Cheng-Yuan Kung, Kaohsiung (TW); Hung-Yi Lin, Kaohsiung (TW); Meng-Wei Hsieh, Kaohsiung (TW); Yu-Pin Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/990,645

(22) Filed: Nov. 18, 2022

(65) Prior Publication Data
US 2023/0078564 A1    Mar. 16, 2023

Related U.S. Application Data

(63) Continuation of application No. 17/111,350, filed on Dec. 3, 2020, now Pat. No. 11,508,668.

(51) Int. Cl.
*H01L 23/552*    (2006.01)
*H01L 21/50*    (2006.01)
*H01L 23/31*    (2006.01)

(52) U.S. Cl.
CPC .......... *H01L 23/552* (2013.01); *H01L 21/50* (2013.01); *H01L 23/31* (2013.01)

(58) Field of Classification Search
CPC .............................. H01L 23/552; H01L 23/31
See application file for complete search history.

(56) References Cited

U.S. PATENT DOCUMENTS

| 6,079,099 | A  | * | 6/2000 | Uchida | ............... | H05K 5/0091 |
| | | | | | | 174/382 |
| 8,748,228 | B2 | * | 6/2014 | Kim | ................. | H01L 23/49816 |
| | | | | | | 438/122 |
| 2004/0178500 | A1 | | 9/2004 | Usui | | |

(Continued)

OTHER PUBLICATIONS

Non-Final Office Action for U.S. Appl. No. 17/111,350, dated Mar. 29, 2022, 15 pages.

(Continued)

*Primary Examiner* — Peniel M Gumedzoe
(74) *Attorney, Agent, or Firm* — FOLEY & LARDNER LLP

(57) ABSTRACT

A semiconductor package structure and a method for manufacturing a semiconductor package structure are provided. The semiconductor package structure includes a device package and a shielding layer. The device package includes an electronic device unit and has a first surface, a second surface opposite to the first surface, and a third surface connecting the first surface to the second surface. The shielding layer is disposed on the first surface and the second surface of the device package. A common edge of the second surface and the third surface includes a first portion exposed from the shielding layer by a first length, and a common edge of the first surface and the third surface includes a second portion exposed from the shielding layer by a second length that is different from the first length.

15 Claims, 17 Drawing Sheets

(56) References Cited

U.S. PATENT DOCUMENTS

| | | | |
|---|---|---|---|
| 2005/0168952 A1* | 8/2005 | Chen | ........................ H01L 23/10 |
| | | | 257/E23.181 |
| 2006/0208347 A1* | 9/2006 | Kim | ........................ H01L 23/04 |
| | | | 257/E23.114 |
| 2014/0085857 A1 | 3/2014 | Chen et al. | |
| 2015/0171021 A1 | 6/2015 | Takano et al. | |
| 2017/0271231 A1 | 9/2017 | Iwamoto | |
| 2020/0335453 A1 | 10/2020 | Hong et al. | |

OTHER PUBLICATIONS

Notice of Allowance for U.S. Appl. No. 17/111,350, dated Jul. 20, 2022, 8 pages.

* cited by examiner

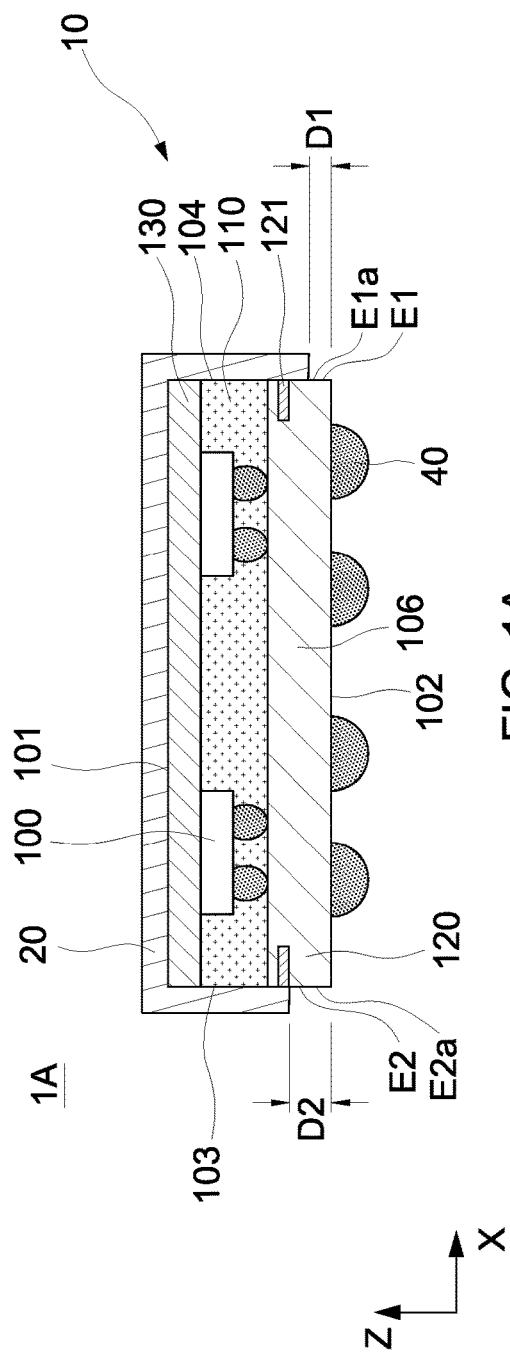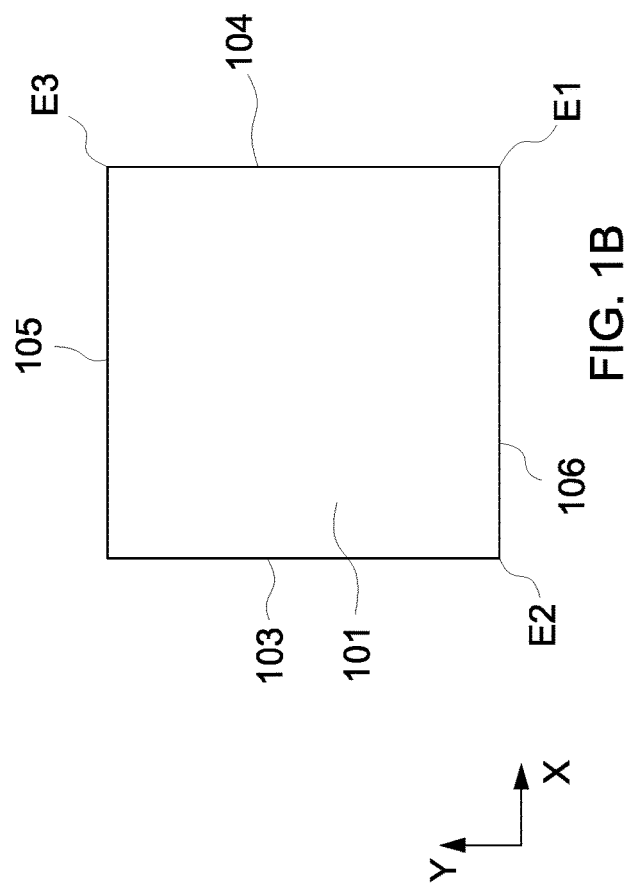

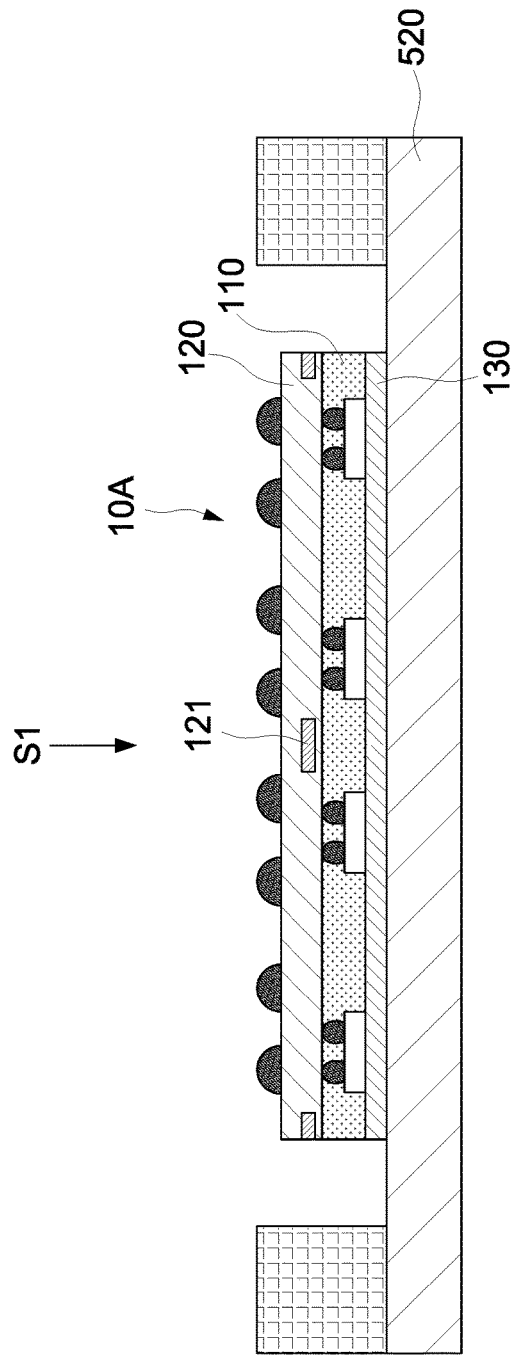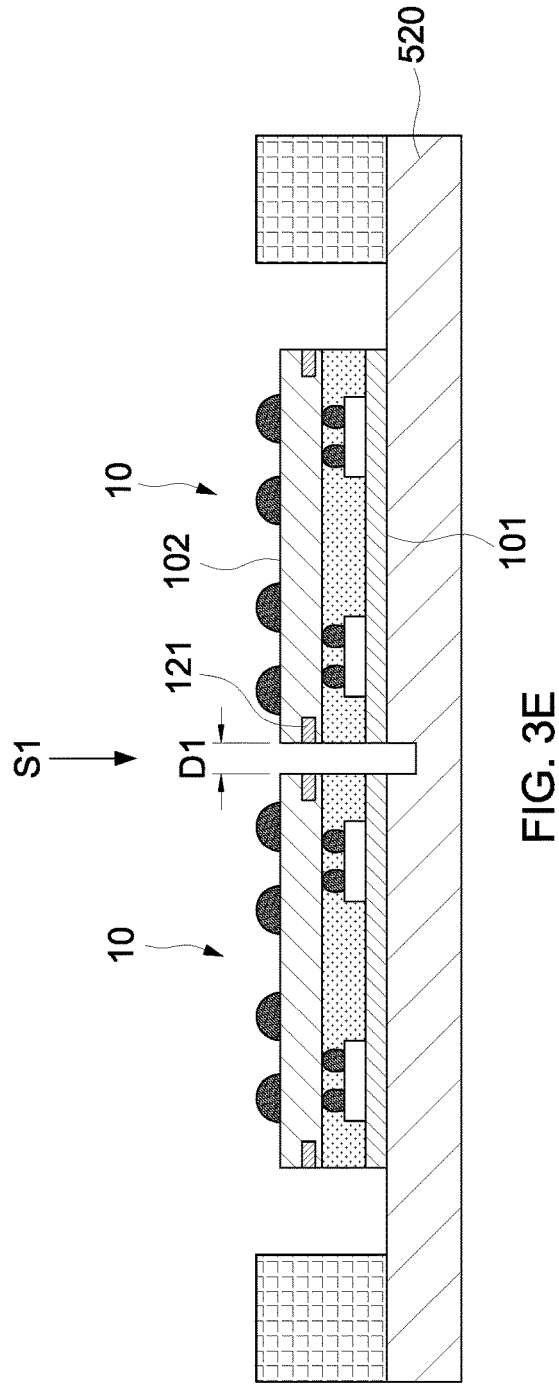

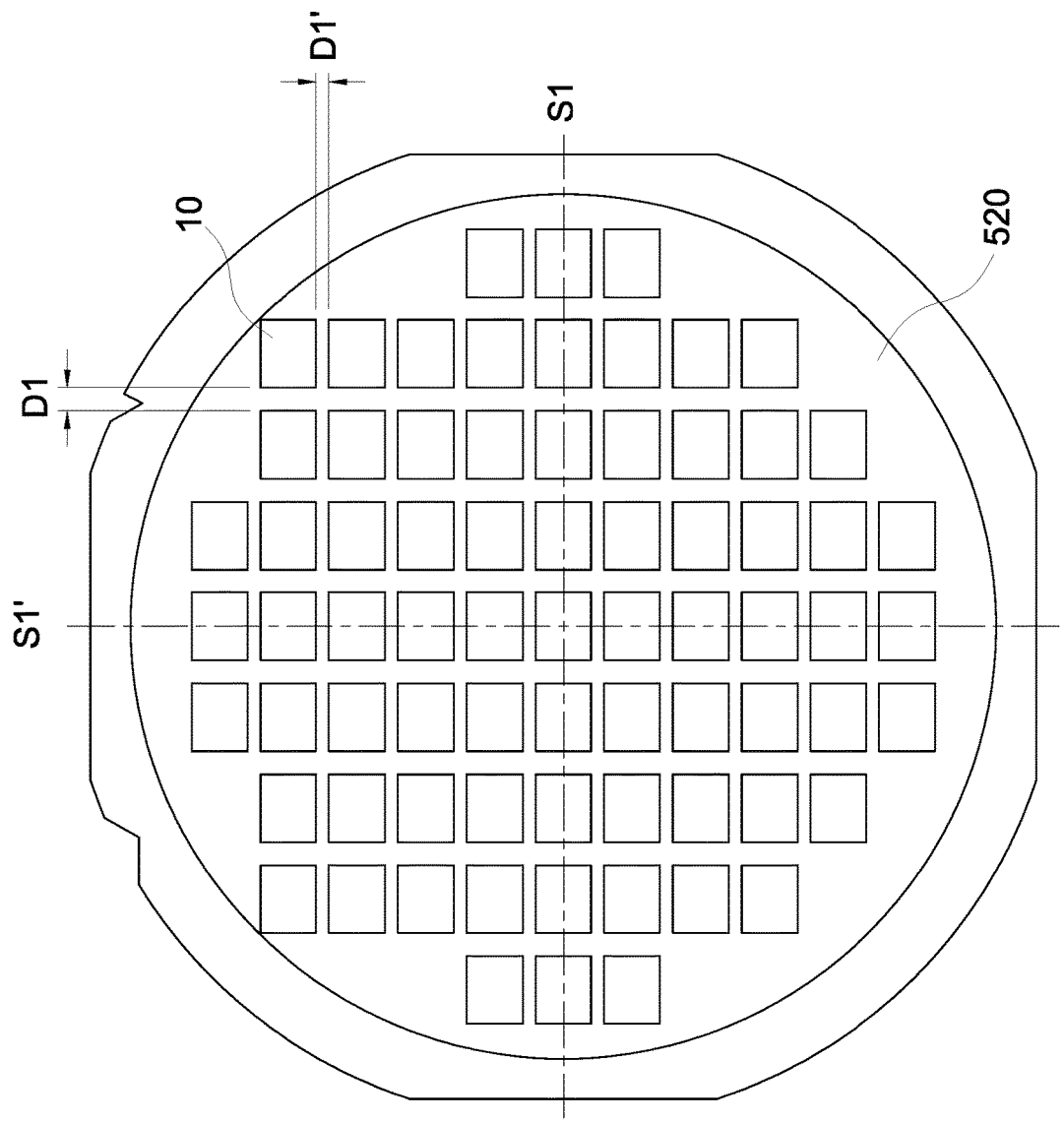
FIG. 3E1

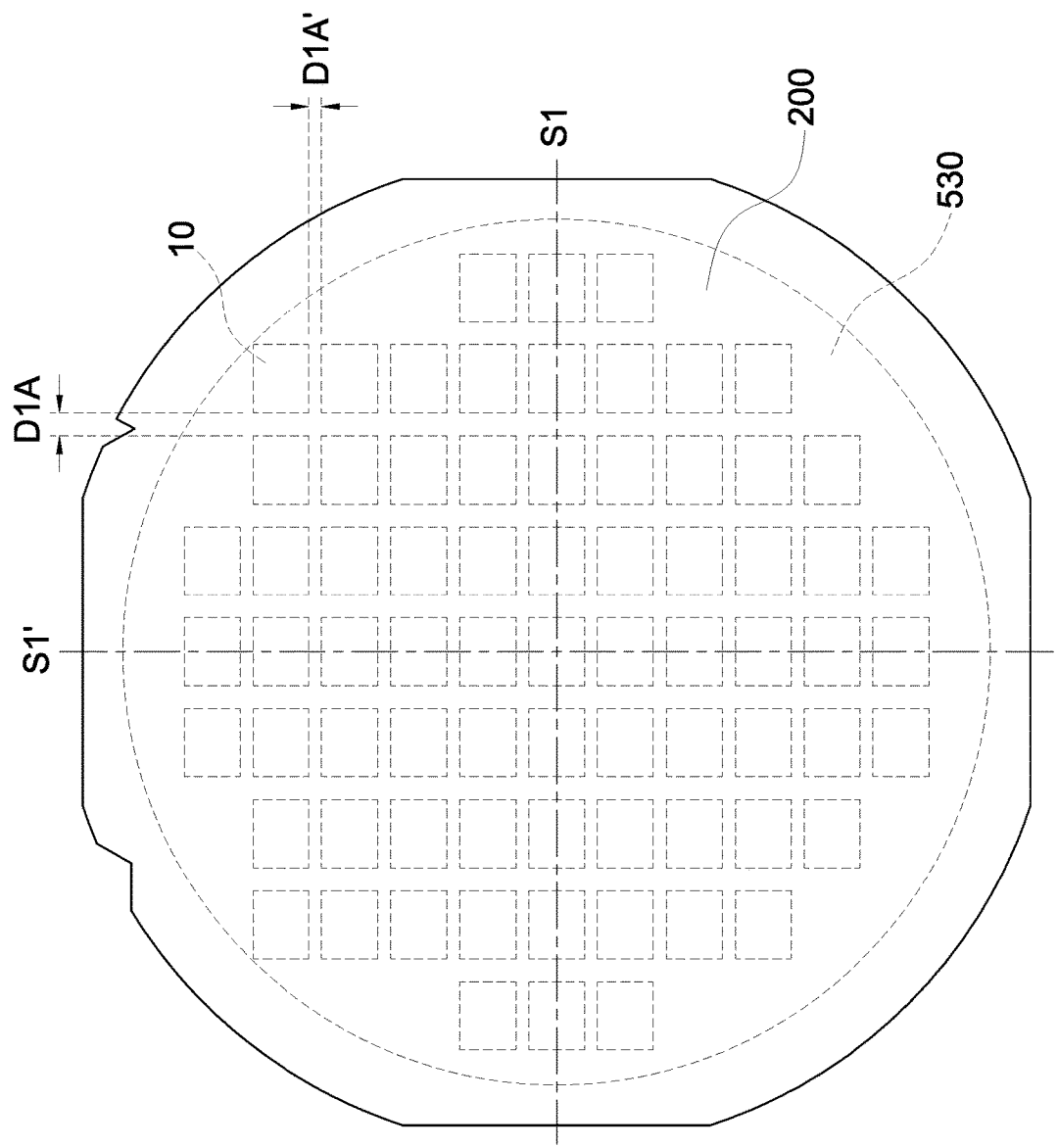
FIG. 3H1

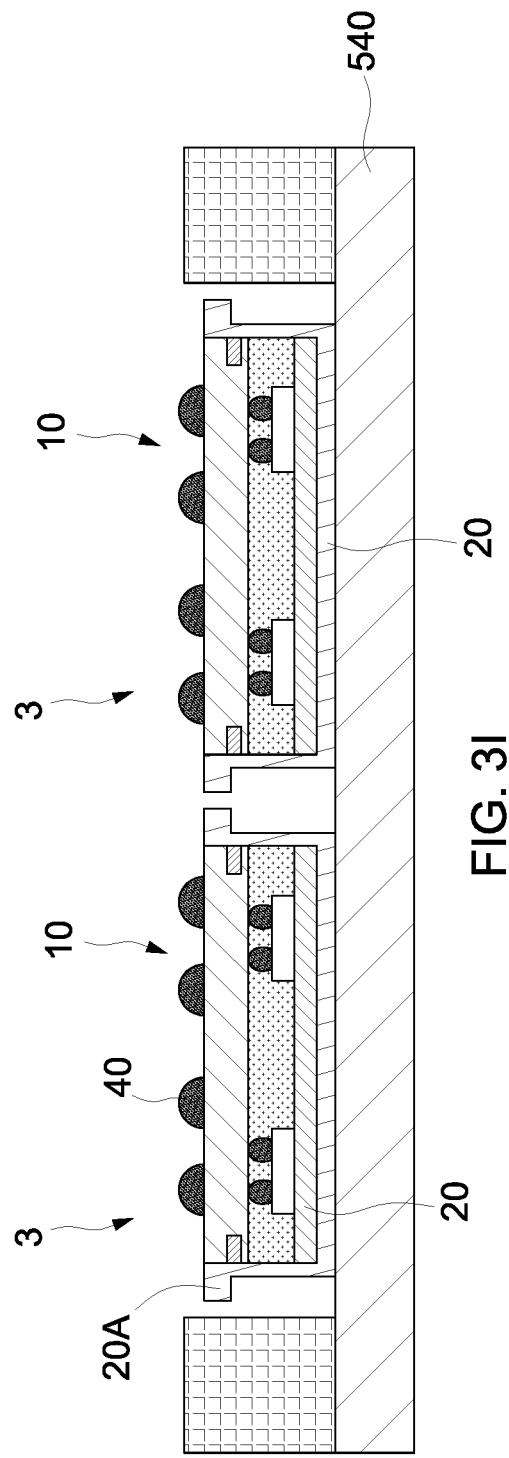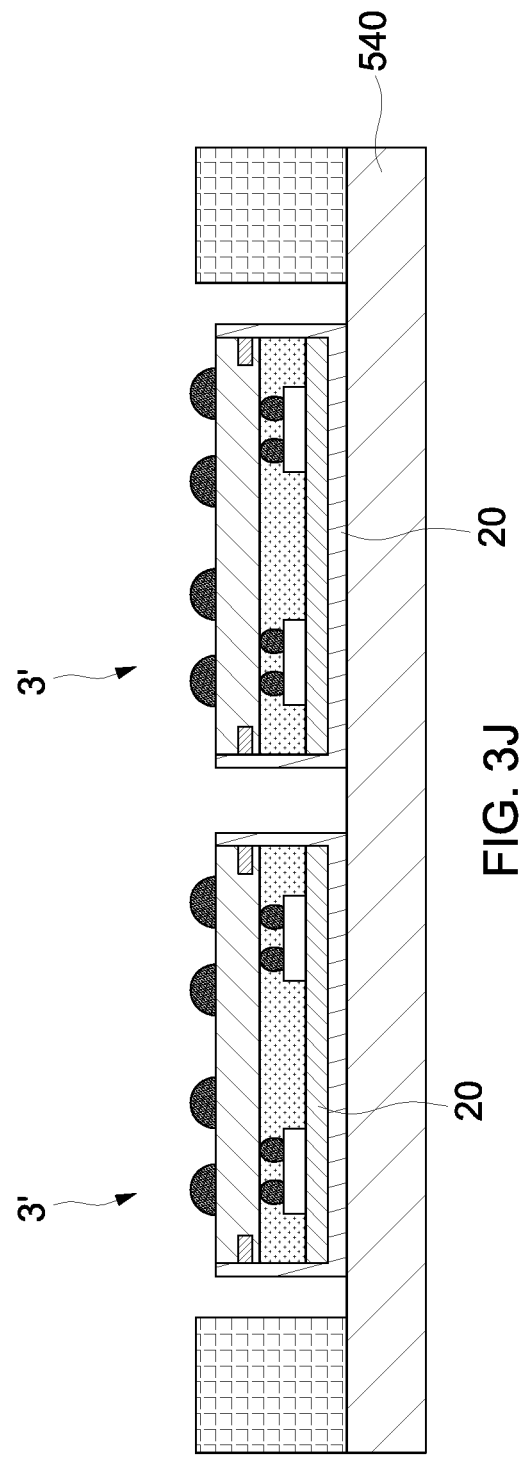

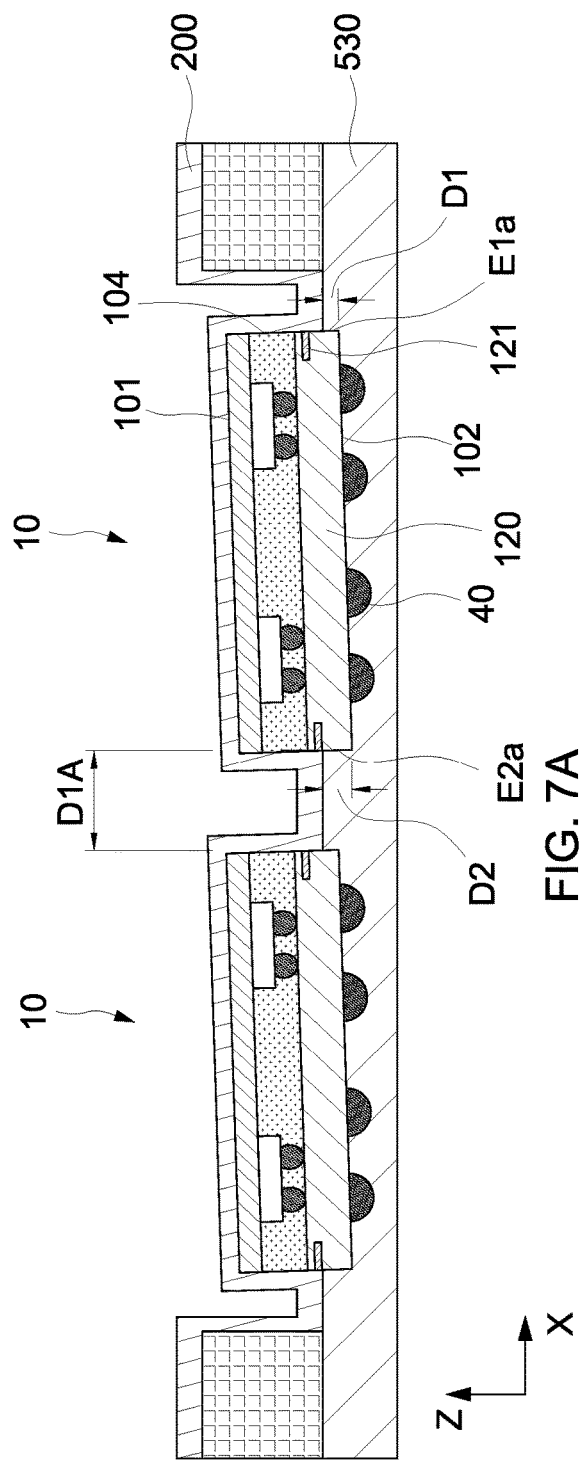
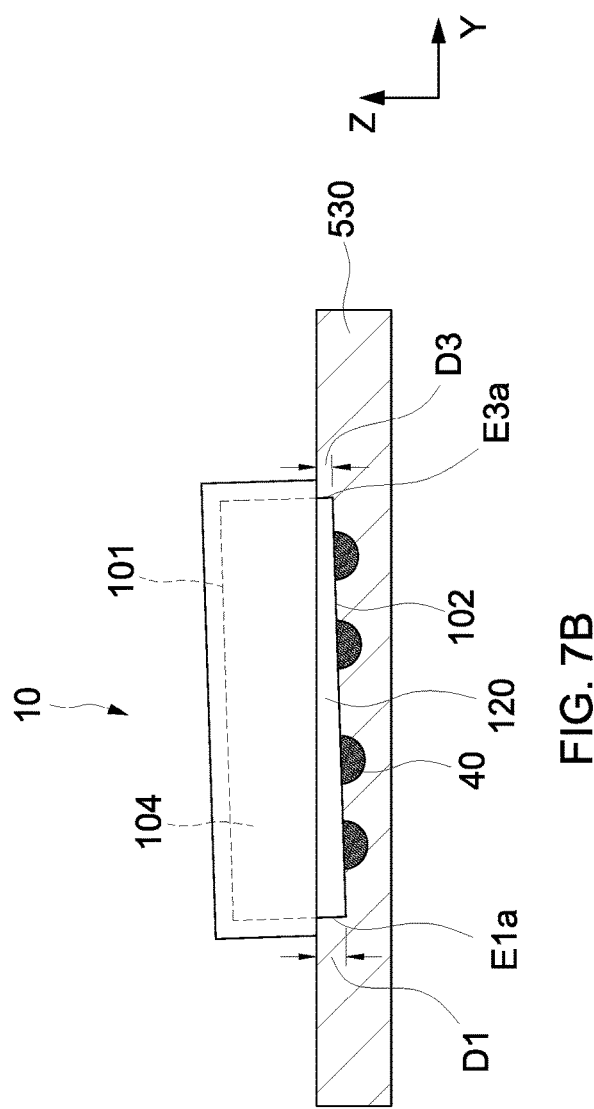

SEMICONDUCTOR PACKAGE STRUCTURE AND METHOD FOR MANUFACTURING THE SAME

CROSS-REFERENCE TO RELATED APPLICATION

This application is a continuation of U.S. patent application Ser. No. 17/111,350 filed Dec. 3, 2020, now issued as U.S. Pat. No. 11,508,668, the contents of which is incorporated herein by reference in its entirety.

BACKGROUND

1. Technical Field

The present disclosure relates generally to a semiconductor package structure and a method for manufacturing a semiconductor package structure, particularly to a semiconductor package structure including a shielding layer and a method for manufacturing a semiconductor package structure including a shielding layer.

2. Description of the Related Art

A semiconductor package structure may include a plurality of electronic components. However, interference between adjacent electronic components may adversely affect the performance of the semiconductor package structure. A shielding structure may be needed to provide shielding effectiveness for the adjacent electronic components.

SUMMARY

In one or more embodiments, a semiconductor package structure includes a device package and a shielding layer. The device package includes an electronic device unit and has a first surface, a second surface opposite to the first surface, and a third surface connecting the first surface to the second surface. The shielding layer is disposed on the first surface and the second surface of the device package. A common edge of the second surface and the third surface includes a first portion exposed from the shielding layer by a first length, and a common edge of the first surface and the third surface includes a second portion exposed from the shielding layer by a second length that is different from the first length.

In one or more embodiments, a method for manufacturing a semiconductor package structure includes the following operations: providing a plurality of device packages; mass transferring the device packages; and forming a shielding material layer on the device packages.

In one or more embodiments, a method for manufacturing a semiconductor package structure includes the following operations: providing a plurality of device packages; moving the device packages to achieve a predetermined distance between the adjacent device packages; and forming a shielding material layer on the device packages.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 1A illustrates a cross-sectional view of a semiconductor package structure in accordance with some embodiments of the present disclosure;

FIG. 1B illustrates a top view of a device package structure in accordance with some embodiments of the present disclosure;

FIG. 3A, FIG. 3B, FIG. 3C, FIG. 3D, FIG. 3E, FIG. 3E1, FIG. 3F, FIG. 3G, FIG. 3H, FIG. 3H1, FIG. 3I, FI. 3J and FIG. 3K illustrate various operations in a method of manufacturing a semiconductor package structure in accordance with some embodiments of the present disclosure;

FIGS. 7A and 7B illustrate one or more operations in a method of manufacturing a semiconductor package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1C:
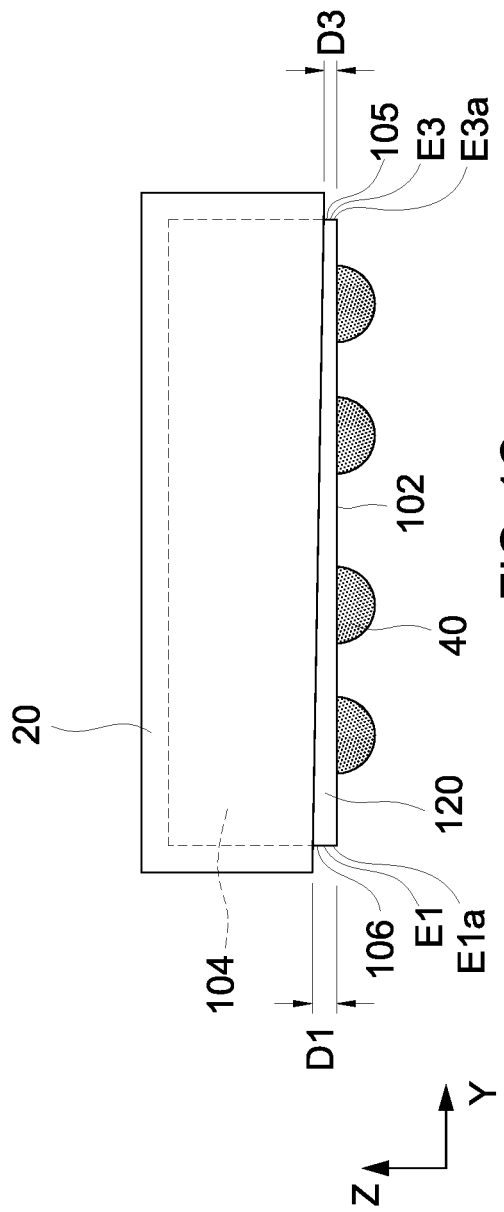
FIG. 1C illustrates a side view of a semiconductor package structure in accordance with some embodiments of the present disclosure.

FIG. 1A illustrates a cross-sectional view of a semiconductor package structure 1A in accordance with some embodiments of the present disclosure. The semiconductor package structure 1A includes a device package 10, a shielding layer 20, and connecting elements 40.

FIG. 1B illustrates a top view of the device package 10 in accordance with some embodiments of the present disclosure. Referring to FIGS. 1A-1B, The device package 10 has a surface 101 (also referred to as "an upper surface" or "an inactive surface"), a surface 103 (also referred to as "a lateral surface") angled with the surface 101, and a surface 102 (also referred to as "a bottom surface" or "an active surface") opposite to the surface 101. In addition, the device package 10 has a surface 104 (also referred to as "a lateral surface") opposite to the surface 103, a surface 106 (also referred to as "a lateral surface") connecting the surface 103 to the surface 104, and a surface 105 (also referred to as "a lateral surface") connected to the surface 104. In some embodiments, the device package 10 includes one or more electronic device units 100, an encapsulant 110, a redistribution layer 120 and an insulating layer 130.

The electronic device unit 100 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

In some embodiments, the encapsulant 110 encapsulates the electronic device unit 100. The encapsulant 110 may include an epoxy resin having fillers, a molding compound (e.g., an epoxy molding compound or other molding compound), polyimide, a phenolic compound or material, a material with a silicone dispersed therein, or a combination thereof.

In some embodiments, the redistribution layer 120 is on the encapsulant 110. In some embodiments, a surface 122 of the redistribution layer 120 is exposed from the device package 10. In some embodiments, the redistribution layer 120 may include a grounding element 121. In some embodiments, the redistribution layer 120 may include a plurality of conductive traces and one or more conductive vias. In some embodiments, the grounding element 121 may be a conductive via or a conductive trace exposed from a lateral surface 120*a* of the redistribution layer 120. In some embodiments, the grounding element 121 may be exposed from the surface 103 of the device package 10.

In some embodiments, the insulating layer 130 is disposed adjacent to the surface 101 (also referred to as "the inactive surface") for avoiding undesirable current leakage. In some embodiments, the encapsulant 110 is between the insulating layer 130 and the redistribution layer 120. In some embodiments, the insulating layer 130 may be formed of or include an organic insulating material, such as polyamide (PA) or polyimide (PI).

In some embodiments, the shielding layer 20 is disposed on the surface 101 (also referred to as "the inactive surface") and the surfaces 103 and 104 (also referred to as "the lateral surfaces") of the device package 10. In some embodiments, a common edge E1 of the surface 104 and the surface 106 of the device package 10 includes a portion E1*a* exposed from the shielding layer 20 by a length D1. In some embodiments, a common edge E2 of the surface 103 and the surface 106 of the device package 10 includes a portion E2*a* exposed from the shielding layer 20 by a length D1. In some embodiments, the length D1 of the portion E1*a* is different from the length D2 of the portion E2*a*.

In some embodiments, an edge of the redistribution layer 120 includes the portion E1*a* of the edge E1. In some embodiments, a portion of an edge of the redistribution layer 120 includes the portion E1*a* of the edge E1. In some embodiments, a portion (i.e., the portion E1*a*) of a common edge of two lateral surfaces of the redistribution layer 120 is exposed from the shielding layer 20 by a length D1. In some embodiments, an edge of the redistribution layer 120 includes the portion E2*a* of the edge E2. In some embodiments, a portion of an edge of the redistribution layer 120 includes the portion E2*a* of the edge E2. In some embodiments, a portion (i.e., the portion E2*a*) of a common edge of two lateral surfaces of the redistribution layer 120 is exposed from the shielding layer 20 by a length D2.

In some embodiments, the insulating layer 130 contacts the shielding layer 20. In some embodiments, the insulating layer 130 directly contacts or physically contacts the shielding layer 20. In some embodiments, the grounding element 121 directly contacts or physically contacts the shielding layer 20. In some embodiments, the shielding layer 20 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof.

In some embodiments, the connecting elements 40 are connected to the redistribution layer 120 of the device package 10. In some embodiments, the connecting elements 40 may be or include solder bumps, solder balls, solder pastes, or a combination thereof. The solder balls may include a controlled collapse chip connection (C4) bump, a ball grid array (BGA) or a land grid array (LGA).

FIG. 1C illustrates a side view of a semiconductor package structure 1A in accordance with some embodiments of the present disclosure. In some embodiments, FIG. 1C illustrates a side view of the structure shown in FIG. 1A as viewed along the x-direction.

In some embodiments, a common edge E3 of the surface 104 and the surface 105 includes a portion E3*a* exposed from the shielding layer by a length D3. In some embodiments, the length D3 of the portion E3*a* of the edge E3 is different from the length D1 of the portion E1*a* of the edge E1. In some embodiments, the length D3 of the portion E3*a* of the edge E3 is less than the length D1 of the portion E1*a* of the edge E1. In some other embodiments, the length D3 of the portion E3*a* of the edge E3 is substantially the same as the length D1 of the portion E1*a* of the edge E1 (not shown in FIG. 1C).

Figure 1D:
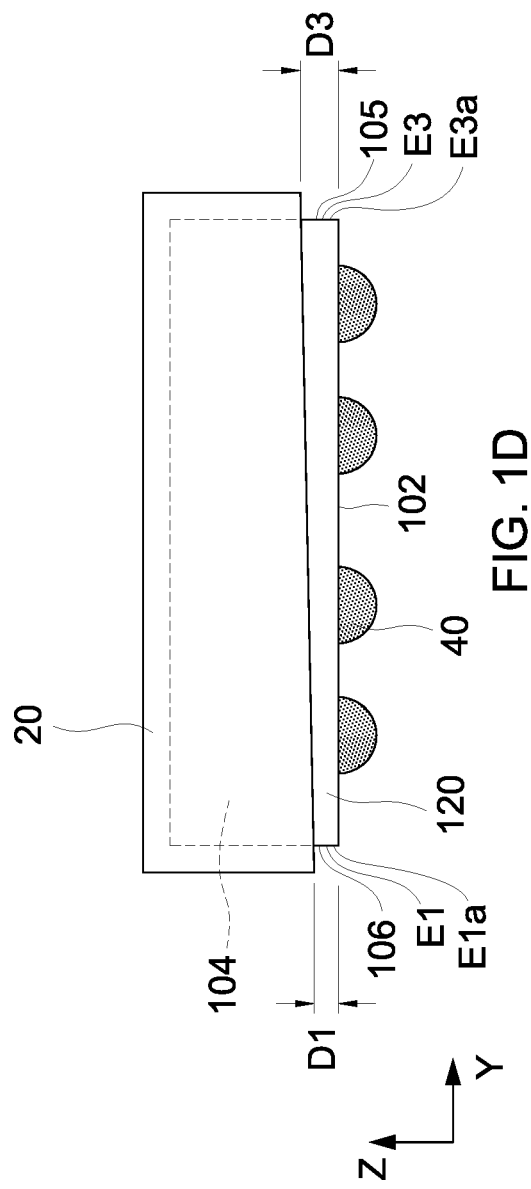
FIG. 1D illustrates a side of a semiconductor package structure in accordance with some embodiments of the present disclosure.

FIG. 1D illustrates a side of a semiconductor package structure 1A in accordance with some embodiments of the present disclosure. The structure illustrated in FIG. 1D is similar to the structure illustrated in FIG. 1C except that, for example, the length D3 of the portion E3*a* of the edge E3 is greater than the length D1 of the portion E1*a* of the edge E1.

Figure 2A:
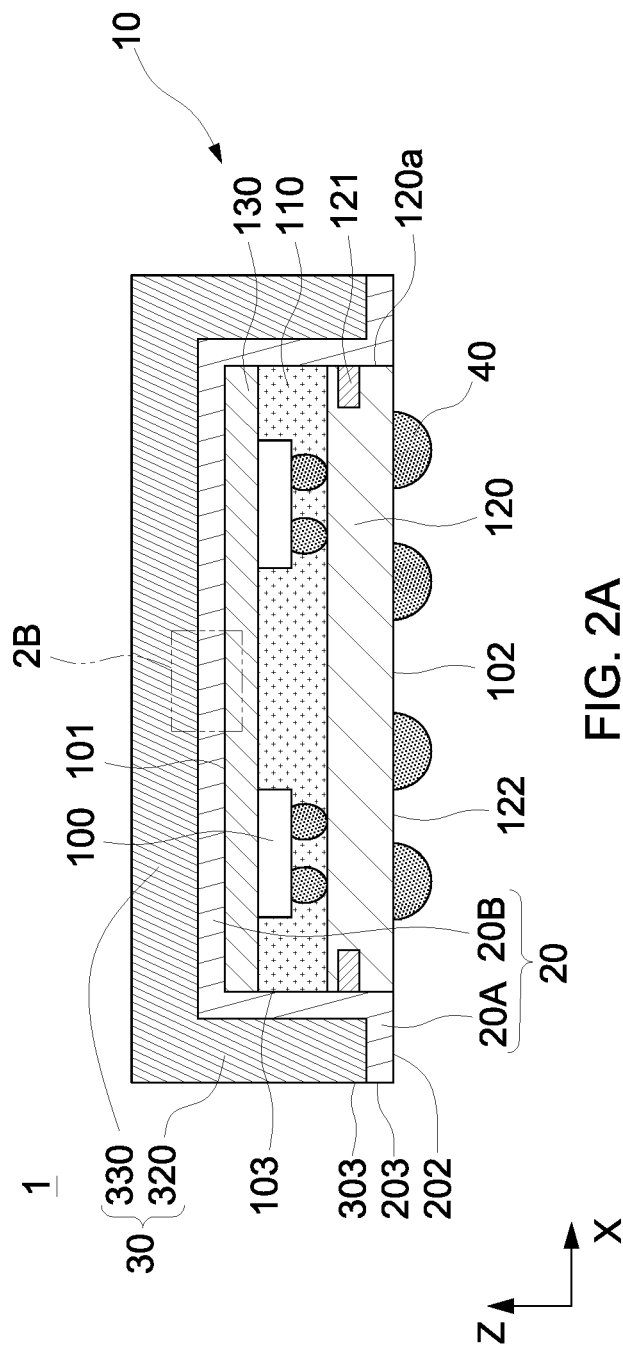
FIG. 2A illustrates a cross-sectional view of a semiconductor package structure in accordance with some embodiments of the present disclosure.

FIG. 2A illustrates a cross-sectional view of a semiconductor package structure 1 in accordance with some embodiments of the present disclosure. The semiconductor package structure 2 is similar to the semiconductor package structure 1A in FIG. 1A except that, for example, the semiconductor package structure 1 further includes a protective layer 30.

In some embodiments, the shielding layer 20 includes portions 20A and 20B. In some embodiments, the portion 20B of the shielding layer 20 covers the surface 101 and the surface 103 of the device package 10. In some embodiments, the portion 20A of the shielding layer 20 extends away from the device package 10. In some embodiments, the portion 20A of the shielding layer 20 includes a surface 202 (also referred to as "a bottom surface") and a surface 203 (also referred to as "a lateral surface). In some embodiments, the surface 122 of the redistribution layer 120 that is exposed from the device package 10 is substantially coplanar with the surface 202 (also referred to as "the bottom surface") of the portion 20A of the shielding layer 20.

In some embodiments, the protective layer 30 is disposed on the shielding layer 20. In some embodiments, the protective layer 30 has a surface 303 (also referred to as "a lateral surface") extending along a direction (e.g., the z-direction) substantially in parallel to the surface 103 of the device package 10. In some embodiments, the lateral surface (i.e., the surface 203) of the shielding layer 20 is substantially coplanar with the lateral surface (i.e., the surface 303) of the protective layer 30. In some embodiments, the protective layer 30 is spaced apart from the device package 10 by the shielding layer 20. In some embodiments, the shielding layer 20 is free from a stainless steel layer contacting the protective layer 30. In some embodiments, the shielding layer 20 is free from a stainless steel layer directly contacting or physically contacting the protective layer 30.

In some embodiments, the protective layer 30 includes portions 320 and 330. In some embodiments, the portion 320 extends along the direction (e.g., the z-direction) substantially in parallel to the surface 103 of the device package 10, and the portion 320 includes the lateral surface (i.e., the surface 303) of the protective layer 30. In some embodiments, the portion 330 of the protective layer 30 is connected to the portion 320 of the protective layer 30 and covers the surface 101 and the surface 103 of the device package 10. In some embodiments, the protective layer 30 may be or include an encapsulant. In some embodiments, the protective layer 30 may be or include an anti-oxidation layer, a scratch resistant layer, or a combination thereof.

According to some embodiments of the present disclosure, the protective layer 30 contacting the shielding layer 20 can protect the shielding layer 20 from oxidation or scratch, and thus an outermost protective material/layer of the structure/composition of the shielding layer 20 may be omitted. Therefore, the manufacturing process can be simplified, and the cost can be reduced while the shielding layer 20 can be protected from damages such as oxidation or scratch.

Figure 2B:
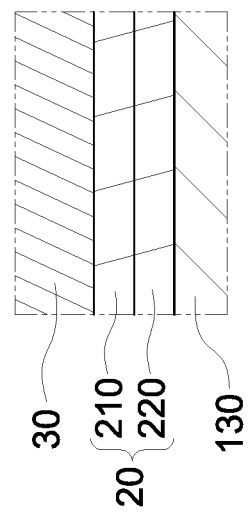
FIG. 2B illustrates an enlarged cross-sectional view of a portion of a semiconductor package structure in accordance with some embodiments of the present disclosure.

FIG. 2B illustrates an enlarged cross-sectional view of a portion of a semiconductor package structure 1 in accordance with some embodiments of the present disclosure. In some embodiments, FIG. 2B illustrates an enlarged cross-sectional view of the structure shown in the dashed box 2B in FIG. 2A.

In some embodiments, the shielding layer 20 includes a multi-layered shielding layer including sub-shielding layers 210 and 220. In some embodiments, the sub-shielding layer 210 contacts the protective layer 30, and the sub-shielding layer 220 contacts the device package 10. In some embodiments, the sub-shielding layer 210 directly contacts or physically contacts the protective layer 30. In some embodiments, the sub-shielding layer 220 directly contacts or physically contacts the device package 10, for example, the insulating layer 130 of the device package 10.

In some embodiments, the sub-shielding layer 210 includes a copper layer, and the sub-shielding layer 220 includes a stainless steel layer, a titanium layer, or a combination thereof. In some embodiments, the shielding layer 20 is free from a stainless steel layer contacting the protective layer 30.

According to some embodiments of the present disclosure, with the aforesaid design of the multi-layered structure of the shielding layer 20, a protective sub-shielding layer (e.g., a stainless steel layer) may be omitted between the sub-shielding layer 210 and the protective layer 30. Therefore, the structures or layers of the shielding layer 20 can be reduced, the total thickness of the shielding layer 20 can be reduced, and the protective layer 30 can serve both as a protective layer for the shielding layer 20 and an encapsulant and/or a passivation layer for the semiconductor package structure, resulting in a reduction of the size of the semiconductor package structure.

Figure 2C:
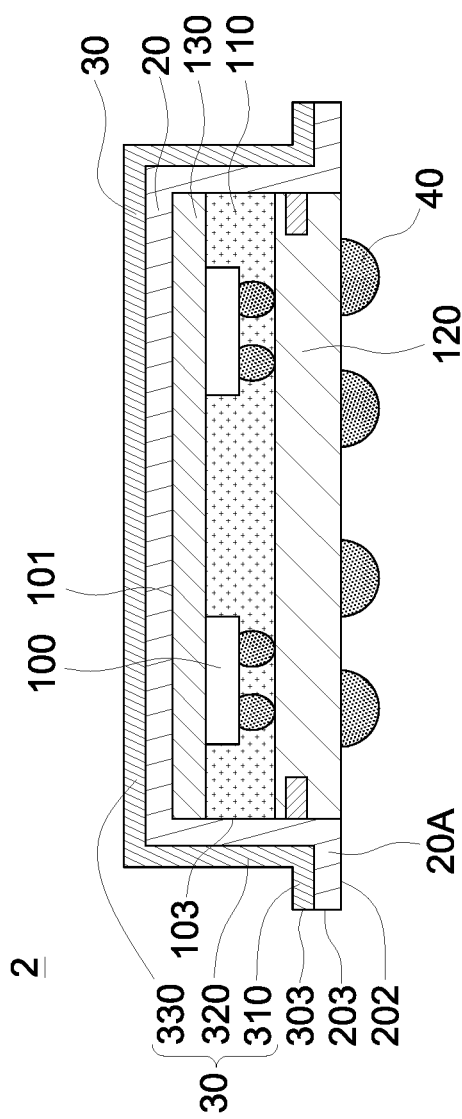
FIG. 2C illustrates a cross-sectional view of a semiconductor package structure in accordance with some embodiments of the present disclosure.

FIG. 2C illustrates a cross-sectional view of a semiconductor package structure 2 in accordance with some embodiments of the present disclosure. The semiconductor package structure 2 is similar to the semiconductor package structure 1 in FIG. 2A except that, for example, the protective layer 30 has a different structure.

In some embodiments, the protective layer 30 includes portions 310, 320 and 330. In some embodiments, the portion 310 extends away from the device package 10. In some embodiments, the portion 310 is protruded from the portion 320. In some embodiments, the portion 310 includes the lateral surface (i.e., the surface 303) of the protective layer 30 that is substantially coplanar with the lateral surface (i.e., the surface 203) of the shielding layer 20. In some embodiments, the protective layer 30 is conformal with the shielding layer 20. In some embodiments, the protective layer 30 may be or include a dielectric layer or a passivation layer.

Figure 3A:
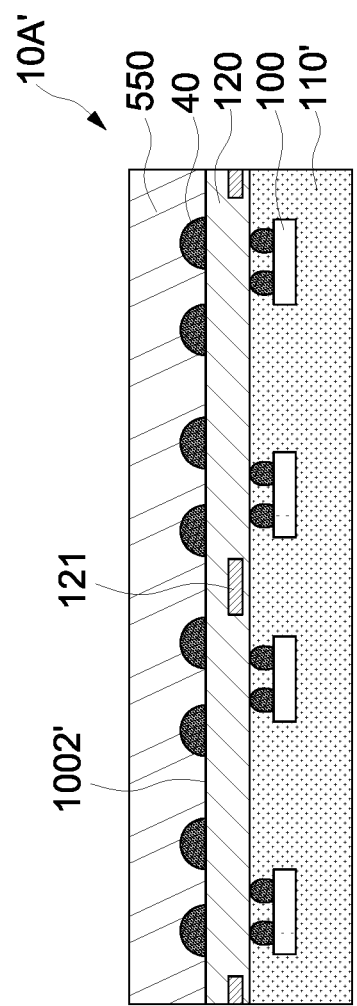
Figure 3B:
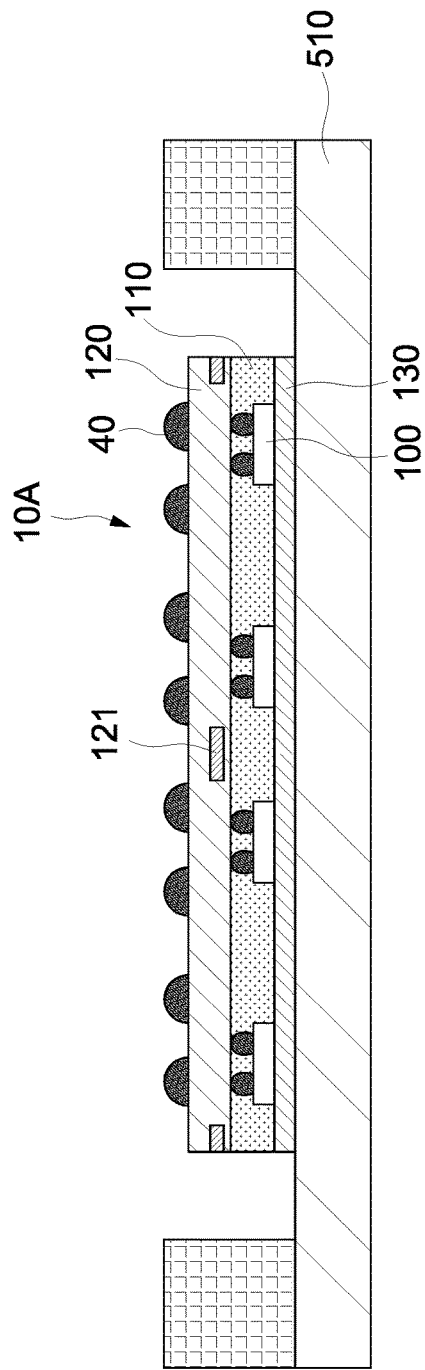
Figure 3C:
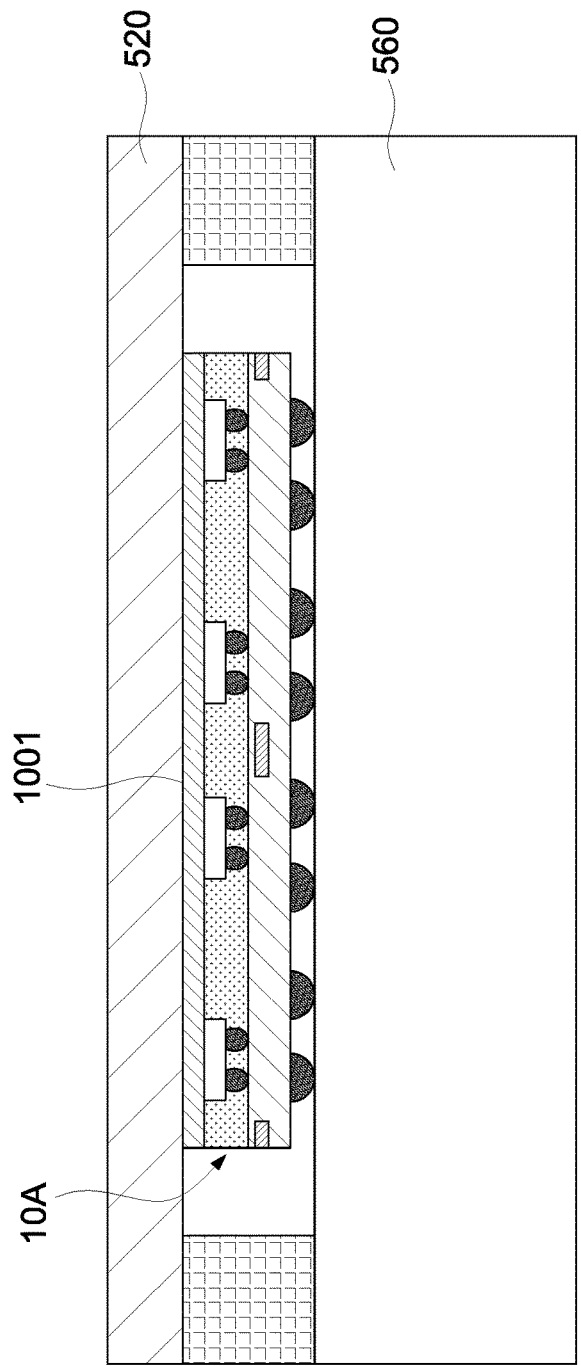
Figure 3F:
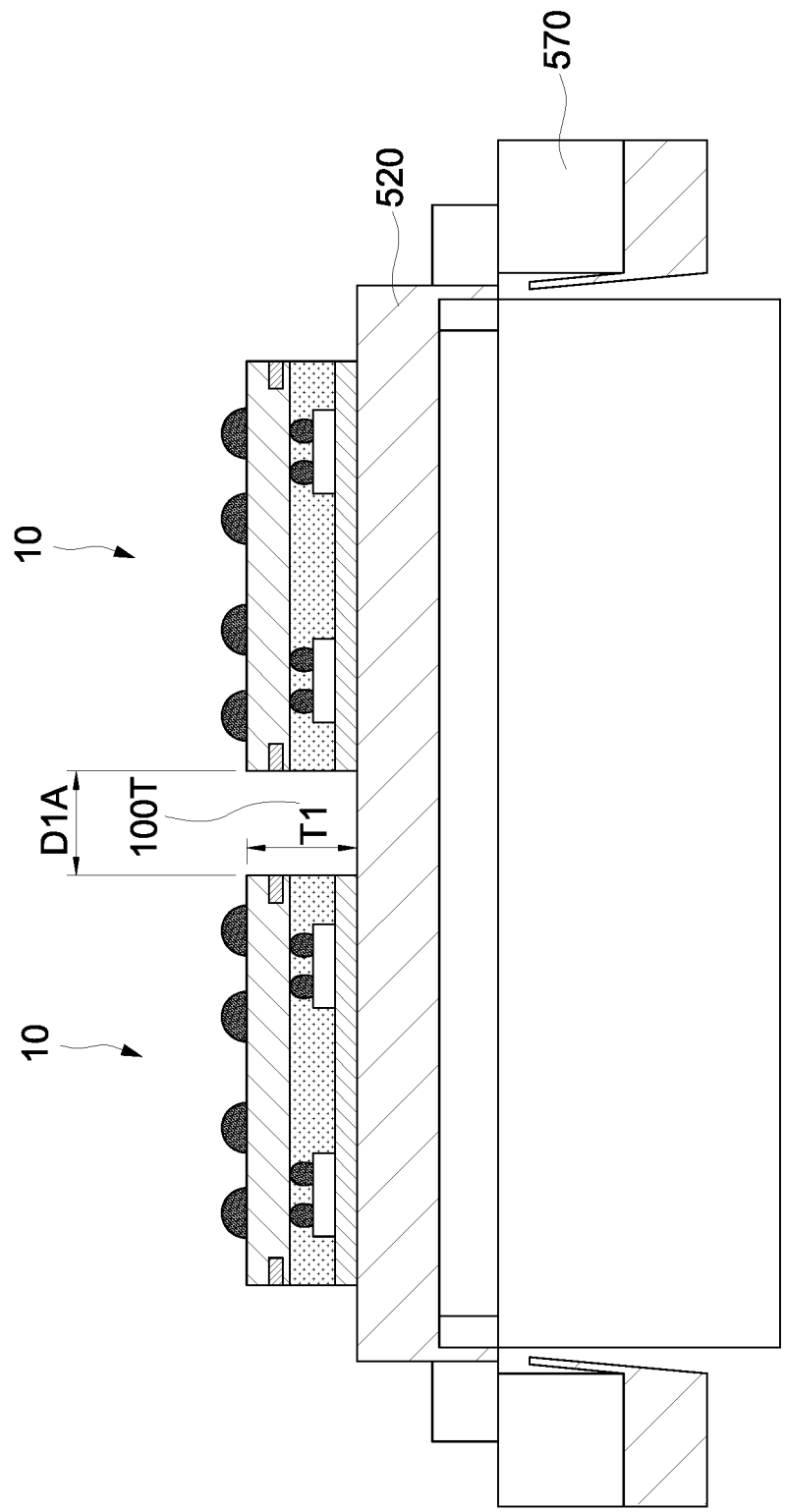
Figure 3G:
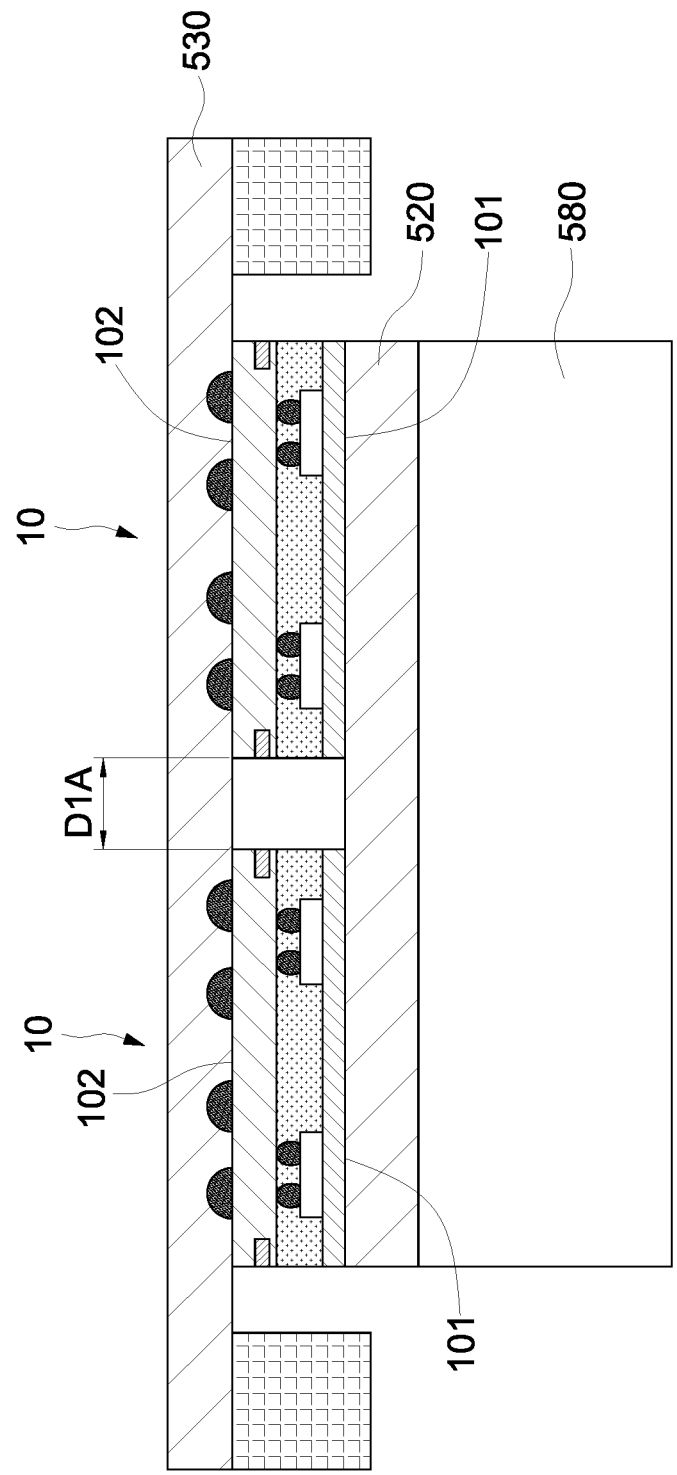
Figure 3H:
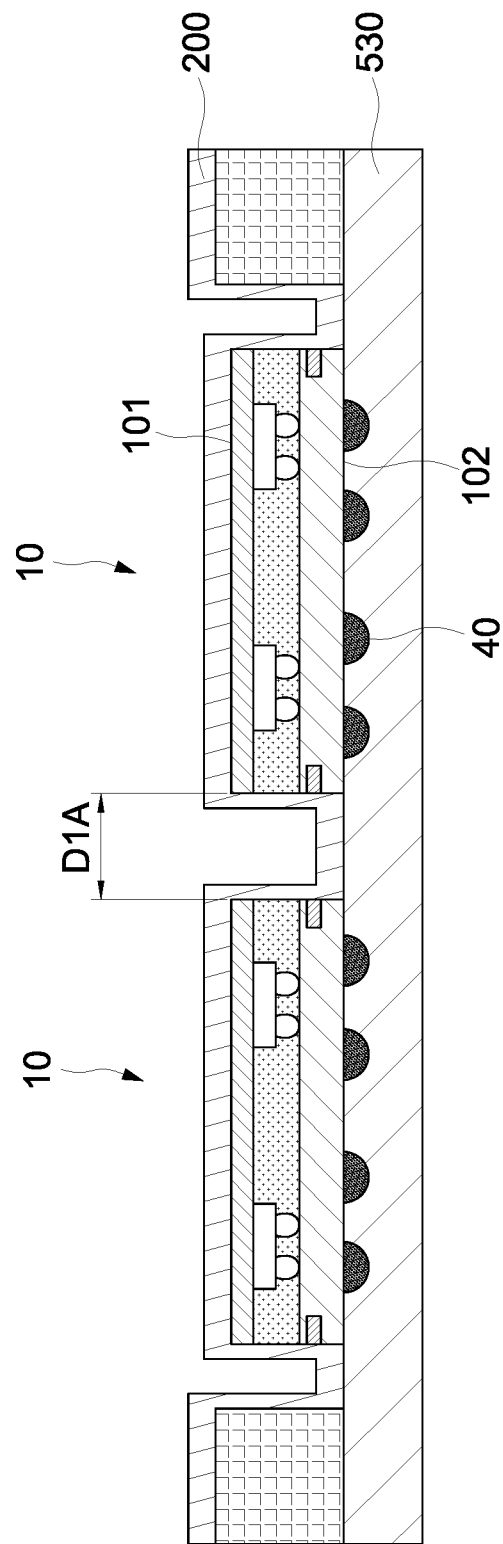
Figure 3K:
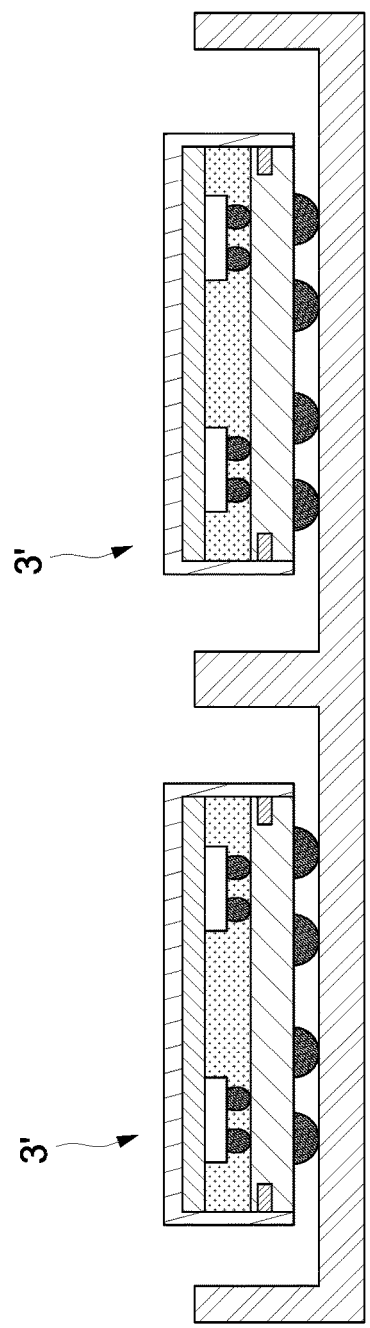

FIG. 3A, FIG. 3B, FIG. 3C, FIG. 3D, FIG. 3E, FIG. 3E1, FIG. 3F, FIG. 3G, FIG. 3H, FIG. 3H1, FIG. 3I, FI. 3J and FIG. 3K illustrate various operations in a method of manufacturing a semiconductor package structure 3 in accordance with some embodiments of the present disclosure.

A plurality of device packages 10 are provided. In some embodiments, a structure including a carrier 520 and the device packages 10 disposed on the carrier 520 is provided, as illustrated in FIG. 3E (which will be discussed hereinafter). In some embodiments, the device packages 10 may be provided on the carrier 520, as illustrated in FIG. 3E (which will be discussed hereinafter). In some embodiments, the device packages 10 may be provided by the operations illustrated in FIGS. 3A-3E.

Referring to FIG. 3A, a device package structure 10A' is provided. In some embodiments, the device package structure 10A' includes a redistribution layer 120, electronic device units 100 on the redistribution layer 120, and an encapsulant 110' encapsulating the electronic device units 100. Connecting elements 40 may be formed on a surface 1002' (also referred to as "a bottom surface" or "an active surface") of the device package structure 10A'. The device package structure 10A' may be disposed on a carrier 550 with the connecting elements 40 facing the carrier 550. The carrier 550 may be a temporary carrier, for example, a back grinding tape, for supporting the device package structure 10A' in a polishing or grinding process. The connecting elements 40 may be embedded in the carrier 550 and thus the surface 1002' of the device package structure 10A' directly contacts or physically contacts the carrier 550.

Referring to FIG. 3B, a portion of the encapsulant 110' is removed, for example, by a polishing or grinding process, to expose the electronic device units 100 from the encapsulant 110. The device package structure 10A' may be disposed on a carrier 510. In some embodiments, an insulating layer 130 may be disposed on the carrier 510, and the device package structure 10A' may be disposed on and contacting the insulating layer 130 on the carrier 510 so as to form an device package structure 10A including the electronic device units 100, the encapsulant 110, the redistribution layer 120, and the insulating layer 130. In some embodiments, the encapsulant 110 and the exposed electronic device units 100 contact the insulating layer 130 on the carrier 510.

Next, still referring to FIG. 3B, the device package structure 10A on the carrier 510 is cured. In some embodiments, the insulating layer 130 of the device package structure 10A on the carrier 510 is cured. In some embodiments, the device package structure 10A on the carrier 510 may be cured by a UV curing process or a thermal curing process. In some embodiments, the insulating layer 130 of the device package structure 10A on the carrier 510 may be cured by a UV curing process or a thermal curing process. In some embodiments, the curing process may be performed at a temperature of equal to or higher than about 130° C. In some embodiments, the carrier 510 has a relatively greater thermal resistance to the heat generated during the curing process of the insulating layer 130 of the device package structure 10A. In some embodiments, the carrier 510 is configured to support the device package structure 10A and the insulating layer 130 thereof in the curing process and be capable of sustaining at a relatively high temperature of the curing process. In some embodiments, a laser marking operation may be performed on the device package structure 10A on the carrier 510.

Referring to FIG. 3C, the device package structure 10A is transferred from the carrier 510 to the carrier 520. In some embodiments, the laser marking operation may be performed on the device package structure 10A on the carrier 510 prior to transferring the device package structure 10A to the carrier 520. In some embodiments, the device package structure 10A with the carrier 510 may be disposed on a base 560, the carrier 510 may be removed from a surface 1001 (also referred to as "an upper surface" or "an inactive surface") of the device package structure 10A, and then the carrier 520 is attached to the surface 1001 of the device package structure 10A. In some embodiments, the carrier 510 has a greater thermal resistance than that of the carrier 520. In some embodiments, the carrier 520 may be or include a dicing tape.

Referring to FIG. 3D, a singulation operation is performed on the device package structure 10A. In some embodiments, performing the singulation operation includes cutting through the device package structure 10A along a scribing line S1. In some embodiments, the scribing line S1 is directly above the grounding element 121 of the redistribution layer 120 of the device package structure 10A. In some embodiments, the device package structure 10A is transferred from the carrier 510 to the carrier 520 prior to performing the singulation operation.

Referring to FIG. 3E, cutting through the device package structure 10A along the scribing line S1 also removes a portion of the carrier 520 under a projection of the scribing line S1. In some embodiments, after the singulation operation is performed on the device package structure 10A, a plurality of device packages 10 are formed on the carrier 520. As such, a structure including the carrier 520 and the device packages 10 disposed on the carrier 520 is provided. The adjacent singulated device packages 10 are separated by a distance D1. In some embodiments, cutting through the device package structure 10A along the scribing line S1 also cuts one grounding element 121 of the device package structure 10A into halves, generating two grounding elements 121 for each of the adjacent singulated device packages 10. In some embodiments, a trench is formed between the adjacent singulated device packages 10, and the grounding element 121 of the redistribution layer 120 of the device package 10 is exposed to the trench.

Referring to FIG. 3E1, which illustrates a top view of the singulated device packages 10 on the carrier 520 in accordance with some embodiments of the present disclosure. In some embodiments, the device package structure 10A may be cut through along a plurality of scribing lines S1 and S1', and the adjacent singulated device packages 10 may be spaced apart by various distances D1 and D1'. The distances D1 and D1' may be the same or different from each other.

Referring to FIG. 3F, the device packages 10 are moved to achieve a predetermined distance (i.e., a distance D1A) between the adjacent device packages 10. In some embodiments, at least two of the device packages 10 are moved in a single operation. In some embodiments, the predetermined distance (i.e., the distance D1A) is a controllable distance or may be adjusted for forming a shielding material layer 200 between adjacent device packages 10 in subsequent operations. In some embodiments, the predetermined distance (i.e., the distance D1A) is configured for forming a shielding material layer 200 between adjacent device packages 10 in subsequent operations. In some embodiments, the carrier 520 may be expanded to achieve the predetermined distance (i.e., the distance D1A). In some embodiments, the carrier 520 is expanded to increase the distance D1 between the adjacent device packages 10. The distance D1 between the adjacent device packages 10 may be increased to a distance D1A. The carrier 520 may be expanded by an expanding apparatus 570. In some embodiments, a trench 100T is defined by the two adjacent device packages 10. In some embodiments, a width of the trench 100T is defined by the distance D1A between the adjacent device packages 10. In some embodiments, an aspect ratio of a thickness T1 of the trench 100T to the width (i.e., the predetermined distance D1A) of the trench 100T is lower than 0.5 after expanding the carrier 520. In some embodiments, the thickness T1 of the trench 100T is defined by the thickness of the electronic device unit 100. In some embodiments, the thickness T1 of the trench 100T is substantially the same as the thickness of the electronic device unit 100.

In some embodiments, since the device package structure 10A may be cut through along various scribing lines S1 and S1', the adjacent singulated device packages 10 may be spaced apart by various distances D1 and D1', and thus the various D1 and D1' may be increased to various predetermined distances D1A and D1A' by expanding the carrier 520 (referring to FIG. 3H1, which will be discussed hereinafter).

Referring to FIG. 3G, the device packages 10 are mass transferred from the carrier 520 to a carrier 530. In some embodiments, the step of mass transferring the device packages 10 may include flipping the device packages 10. In some embodiments, at least two of the device packages 10 are flipped in a single operation. In some embodiments, the step of mass transferring the device packages 10 may include attaching a carrier 530 to the device packages 10. In some embodiments, the step of mass transferring the device packages 10 may include flipping the device packages 10 to the carrier 530. In some embodiments, the carrier 520 is expanded to increase the distance D1 between the adjacent device packages 10 to the distance D1A prior to mass transferring the device packages 10 from the carrier 520 to the carrier 530.

In some embodiments, mass transferring the device packages 10 from the carrier 520 to the carrier 530 may include the following operations: attaching the carrier 530 to the device packages 10; and removing the carrier 520 from the device packages 10 after attaching the carrier 530 to the device packages 10. In some embodiments, the carrier 520 is removed from the device packages 10 after attaching the carrier 530 to the device packages 10. In some embodiments, each of the device packages 10 has a surface 101 facing the carrier 520 and a surface 102 opposite to the surface 101, and the carrier 530 is attached to the surfaces 102 of the device packages 10. In some embodiments, the device packages 10 on the carrier 520 can be disposed on a base 580 with the carrier 520 facing the base 580 prior to attaching the carrier 530 to the device packages 10. In some embodiments, after the carrier 530 is attached on the surfaces 102 of the device packages 10, the device packages 10 with the carriers 520 and 530 on two opposite surfaces 101 and 102 of the device packages 10 are removed from the base 580, and then the carrier 520 is removed from the device packages 10. The connecting elements 40 may be embedded in the carrier 530 and thus the surfaces 102 of the device packages 10 directly contacts or physically contacts the carrier 530. In some embodiments, the carrier 530 may include a tape or an adhesive layer.

In some embodiments, the aspect ratio of the thickness T1 of the trench 100T to the width (i.e., the distance D1A) of the trench 100T remains substantially the same after mass transferring the device packages 10 from the carrier 520 to the carrier 530. In some embodiments, the aspect ratio of the thickness (i.e., the thickness T1) of the electronic device unit 100 to the distance D1A between two adjacent device packages 10 is lower than 0.5. In some embodiments, the distances D1A and D1A' between the device packages 10 remain substantially unchanged after the mass transfer.

Referring to FIG. 3H, a shielding material layer 200 is formed on the device packages 10. In some embodiments, the shielding material layer 200 is formed on the surfaces 101 of the device packages 10. In some embodiments, the shielding material layer 200 is further formed over the carrier 530. In some embodiments, the shielding material layer 200 is formed as a continuous layer over the device packages 10 and the carrier 530. In some embodiments, forming the shielding material layer 200 on the device packages 10 and forming the shielding material layer 200 on the carrier 530 are performed in the same operation. In some embodiments, the shielding material layer 200 is formed by sputtering. In some embodiments, the carrier 530 is configured to support the device packages 10 in the sputtering process and be capable of sustaining at a relatively high energy generated from the sputtering process.

Referring to FIG. 3H1, which illustrates a top view of the shielding material layer 200 formed on the singulated device packages 10 on the carrier 530 in accordance with some embodiments of the present disclosure. In some embodiments, the shielding material layer 200 covers the device packages 10 and the carrier 530 from a top view perspective.

In the cases where singulated device packages are picked and placed on a carrier followed by forming shielding layers on the singulated device packages, the operation of picking up the device packages and then placing the device packages on another carrier may undesirably change the distances between the device packages and decrease the uniformity of the arrangement of the device packages. For example, some of the distances between adjacent device packages may be too small for the shielding layer to be formed uniformly. As a result, the manufacturing process is complicated, and the yield of the packages is reduced. In contrast, according to some embodiments of the present disclosure, the device packages 10 are mass transferred to the carrier 530 followed by forming the shielding material layer 200 on the device packages 10 on the carrier 530, such that the picking and placing operation is omitted, and the arrangement of the device packages 10 on the carrier 530 can be remained substantially the same as the arrangement of the device packages 10 after the expanding operation illustrated in FI. 3F. Therefore, the shielding material layer 200 can be formed uniformly on the device packages 10, the manufacturing process is simplified, and the yield of the semiconductor package structures is increased.

Referring to FIG. 3I, the shielding material layer 200 is separated into a plurality of shielding layers 20. In some embodiments, each of the shielding layers 20 is on each of the device packages 10. In some embodiments, the shielding material layer 200 is separated by picking and placing each of the device packages 10 onto a carrier 540. In some embodiments, the shielding layer 20 includes a portion 20A extending away from the electronic device unit 100. In some embodiments, the grounding element 121 directly contacts or physically contacts the shielding layer 20. As such, one or more semiconductor package structures 3 are formed.

Referring to FIG. 3J, edges of the shielding layers 20 are deburred. In some embodiments, deburring the edges of the shielding layer 20 includes removing portions 20A of the shielding layers 20, so as to form substantially planar lateral surfaces of the shielding layers 20. As such, one or more semiconductor package structures 3' are formed. While the portions 20A are formed by separating the shielding layers 20 by picking and placing each of the device packages 10, the portions 20A may be formed with a surface having a relatively high roughness. According to some embodiments of the present disclosure, deburring the edges of the shielding layers 20 provide relatively smooth surfaces of the shielding layers 20, and thus the electrical performance of the shielding layer 20 can be improved.

Referring to FIG. 3K, the semiconductor package structures 3' (or the semiconductor package structures 3) may be displaced on a transport mechanism, for example, a transport roller or a transport cassette for subsequent processes.

Figure 4A:
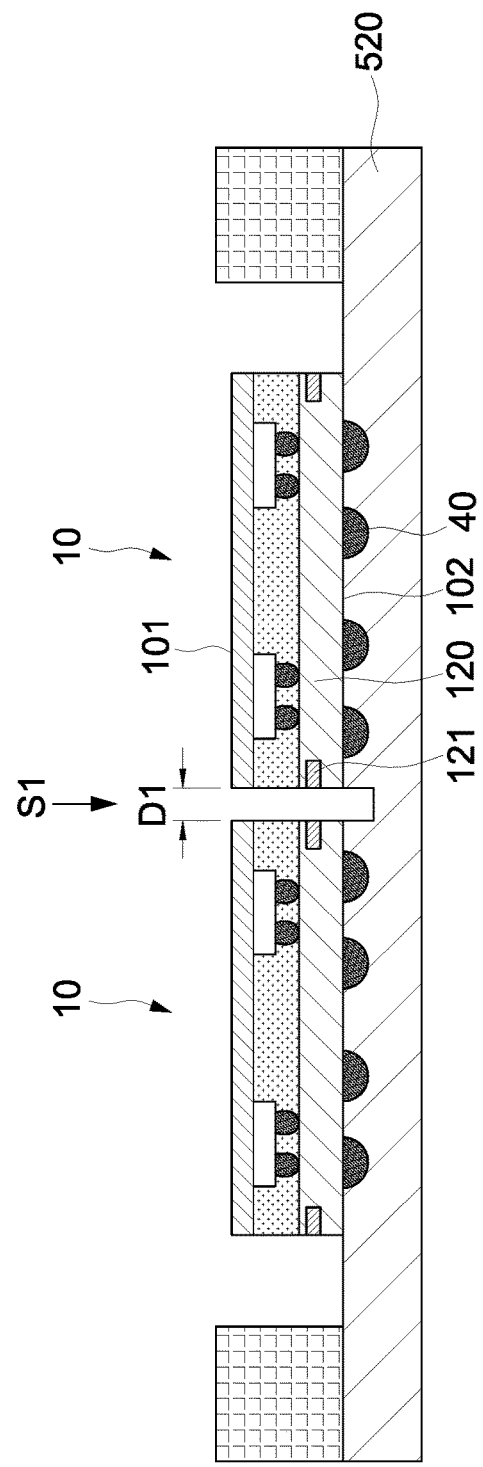
FIG. 4A, FIG. 4B and FIG. 4C illustrate various operations in a method of manufacturing a semiconductor package structure in accordance with some embodiments of the present disclosure.
Figure 4B:
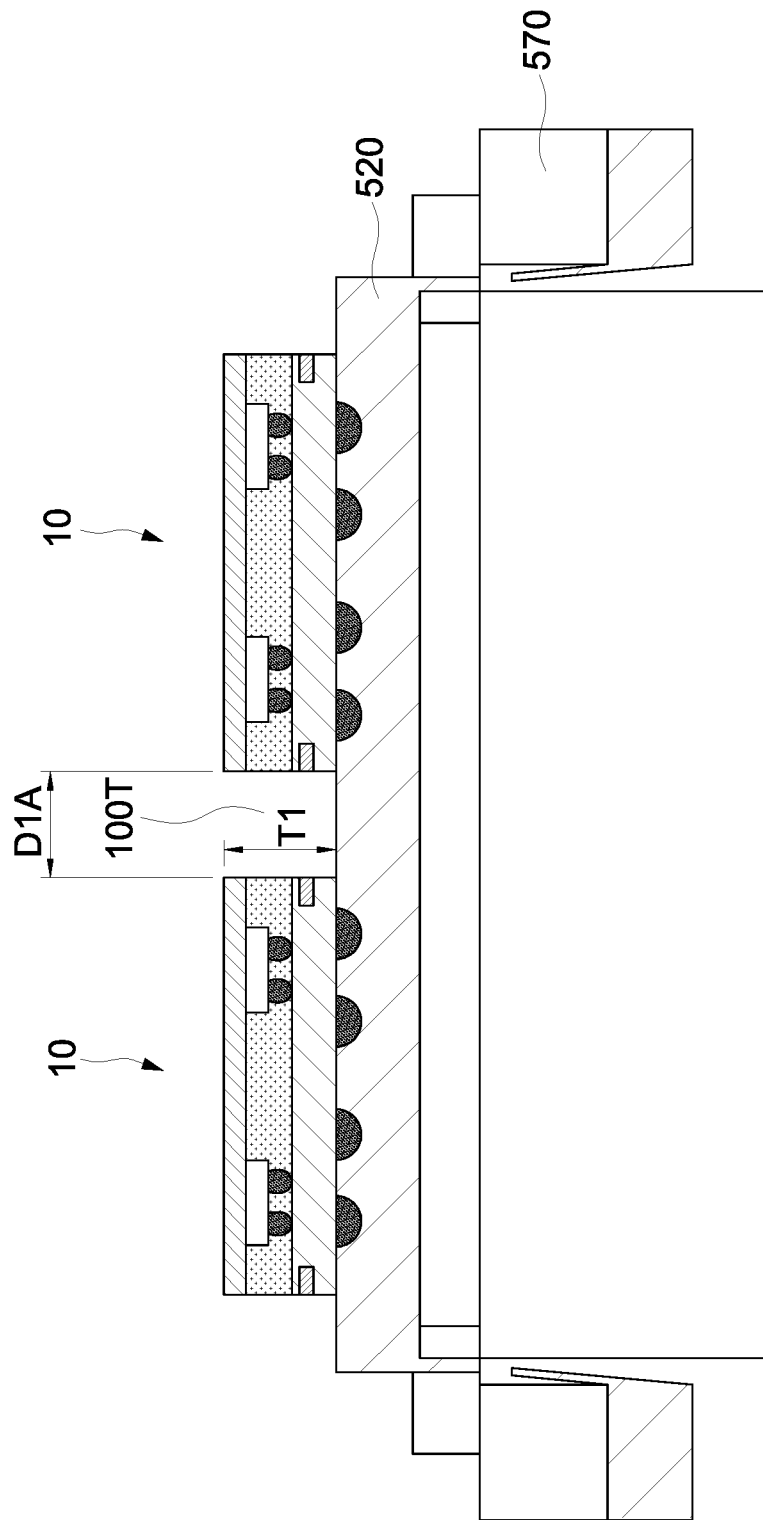
Figure 4C:
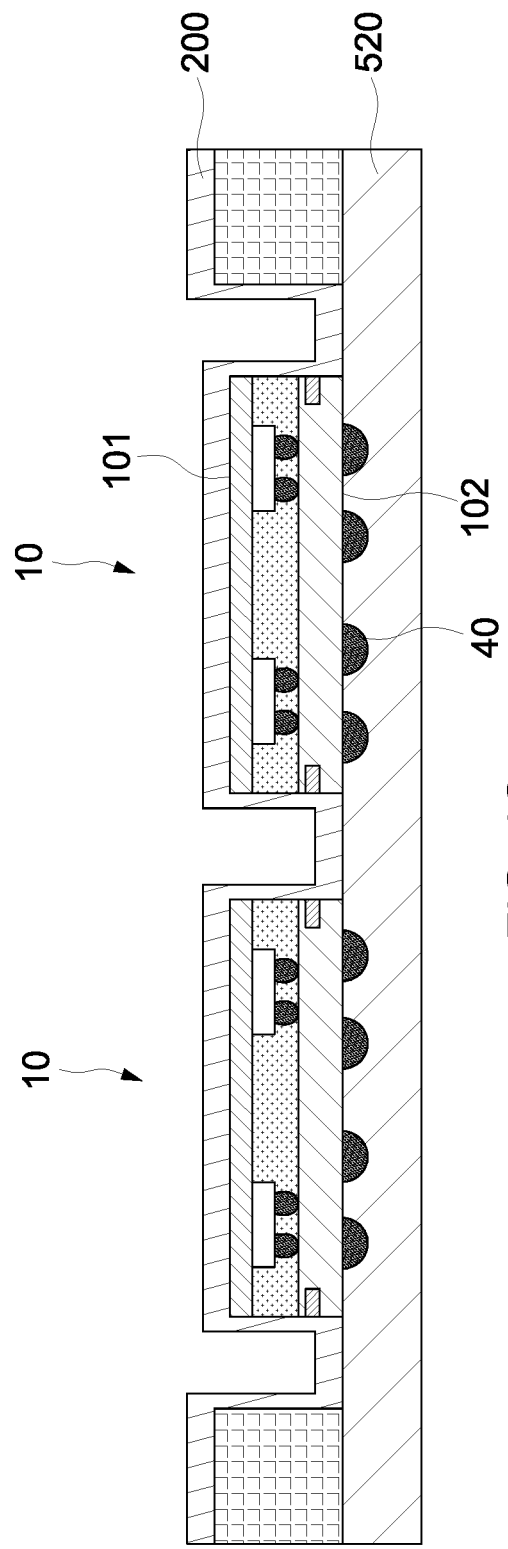

FIG. 4A, FIG. 4B and FIG. 4C illustrate various operations in a method of manufacturing a semiconductor package structure in accordance with some embodiments of the present disclosure.

Referring to FIG. 4A, a device package structure 10A on a carrier 520, and a singulation operation is performed on the device package structure 10A to form a plurality of device packages 10 on the carrier 520. In some embodiments, there is free from the step of heating the device package structure 10A between the operation of disposing the device package structure 10A on the carrier 520 and the singulation operation of the device package structure 10A. For example, the insulating layer 130 is formed on the redistribution layer 120 to form the device package structure 10A prior to disposing the device package structure 10A on the carrier 520. In some embodiments, there is free from a UV curing process and/or a thermal curing process on the device package structure 10A on the carrier 520.

Referring to FIG. 4B, the carrier 520 is expanded to increase the distance D1 between the adjacent device packages 10. The distance D1 between the adjacent device packages 10 may be increased to a predetermined distance (i.e. a distance D1A). The carrier 520 may be expanded by an expanding apparatus 570. In some embodiments, a trench 100T is defined by the two adjacent device packages 10. In some embodiments, a width of the trench 100T is defined by the distance D1A between the adjacent device packages 10. In some embodiments, an aspect ratio of a thickness T1 of the trench 100T to the width (i.e., the predetermined distance D1A) of the trench 100T is lower than 0.5 after expanding the carrier 520. In some embodiments, the thickness T1 of the trench 100T is defined by the thickness of the electronic device unit 100. In some embodiments, the thickness T1 of the trench 100T is substantially the same as the thickness of the electronic device unit 100. In some embodiments, the carrier 520 may be or include a dicing tape.

Referring to FIG. 4C, a shielding material layer 200 is formed on the device packages 10. In some embodiments, the shielding material layer 200 is further formed on the carrier 520. In some embodiments, the shielding material layer 200 is formed as a continuous layer over the device packages 10 and the carrier 520. In some embodiments, forming the shielding material layer 200 on the device packages 10 and forming the shielding material layer 200 on the carrier 520 are performed in the same operation. In some embodiments, the shielding material layer 200 is formed by sputtering. In some embodiments, the operation of forming the shielding material layer 200 on the carrier 520 is after expanding the carrier 520. In some embodiments, the carrier 520 is configured to support the device packages 10 in the sputtering process and be capable of sustaining at a relatively high energy generated from the sputtering process.

According to some embodiments of the present disclosure, the device packages 10 are disposed on the carrier 520 followed by expanding the carrier 20 and then forming the shielding material layer 200 on the device packages 10 and the same carrier 520. Therefore, the distances between the device packages 10 on the carrier 520 prior to the expanding operation can be relatively small, and thus the substrate utilization (i.e. the utilization of the area of the carrier 520) can be relatively high, indicating a greater amount of the device packages 10 can be disposed on the carrier 520, which will be expanded and serve as a support substrate for forming the shielding material layer 200.

Next, operations similar to those illustrated in FIGS. 3I-3K may be performed on the structure shown in FIG. 4C, so as to form one or more semiconductor package structures 3 or one or more semiconductor package structures 3'.

Figure 5:
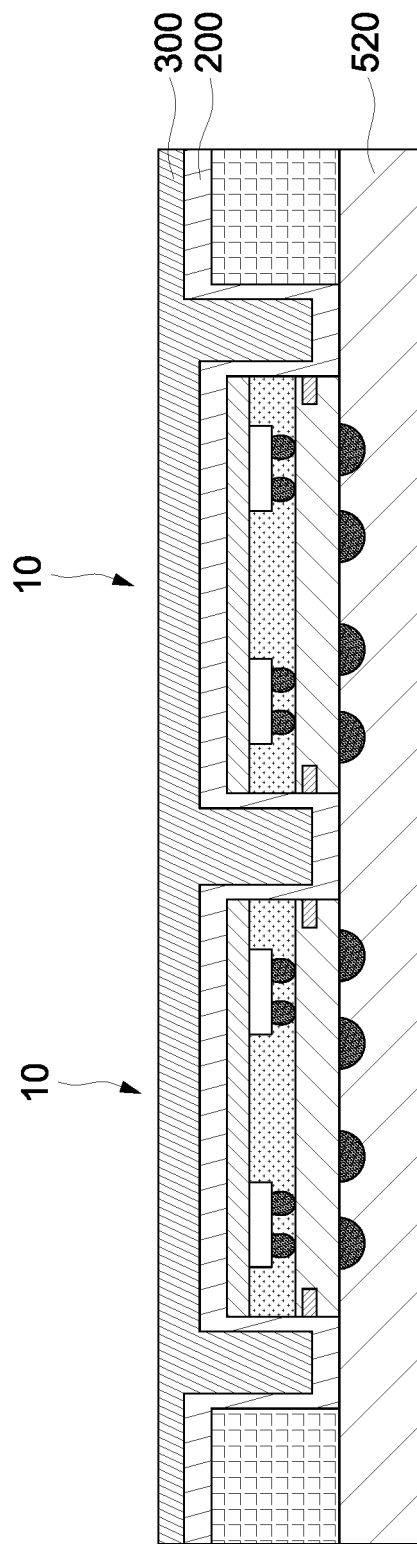
FIG. 5 illustrates one or more operations in a method of manufacturing a semiconductor package structure in accordance with some embodiments of the present disclosure.

FIG. 5 illustrates one or more operations in a method of manufacturing a semiconductor package structure 1 in accordance with some embodiments of the present disclosure.

In some embodiments, the operations illustrated in FIGS. 3A-3H or FIGS. 4A-4C are performed. Next, referring to FIG. 5, a protective material layer 300 is formed on the shielding material layer 200. In some embodiments, the protective material layer 300 may be formed by applying a molding compound or an encapsulant onto the shielding material layer 200.

Next, a singulation operation may be performed on the structure shown in FIG. 5 to form one or more semiconductor package structures 1 shown in FIG. 1. In some embodiments, performing the singulation operation includes cutting through the protective material layer 300 and the shielding material layer 200 between the adjacent device packages 10.

Figure 6:
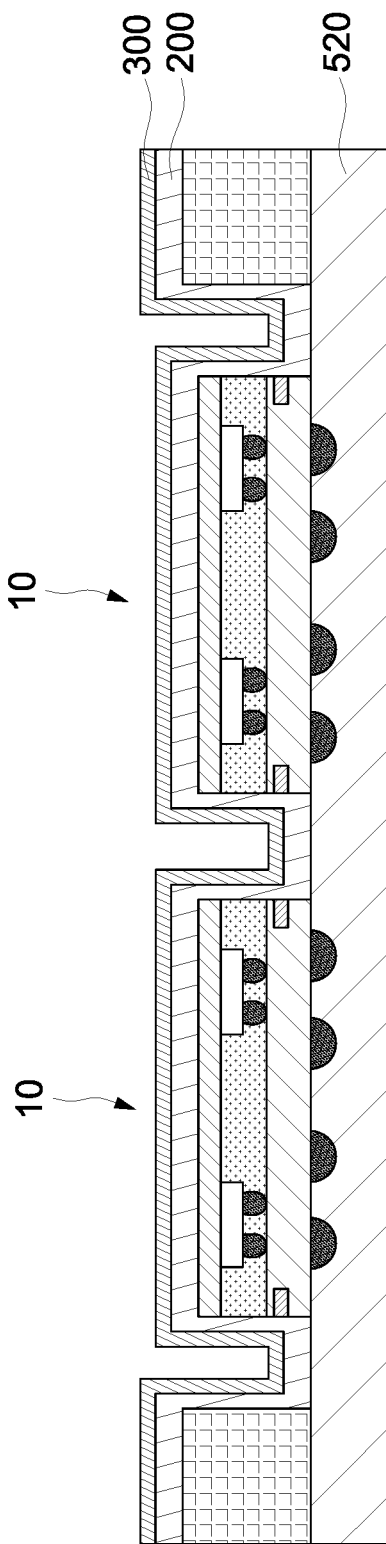
FIG. 6 illustrates one or more operations in a method of manufacturing a semiconductor package structure in accordance with some embodiments of the present disclosure.

FIG. 6 illustrates one or more operations in a method of manufacturing a semiconductor package structure 2 in accordance with some embodiments of the present disclosure.

In some embodiments, the operations illustrated in FIGS. 3A-3H or FIGS. 4A-4C are performed. Next, referring to FIG. 6, a protective material layer 300 is formed on the shielding material layer 200. In some embodiments, the protective material layer 300 is conformal with the shielding material layer 200. The protective material layer 300 may be formed by a deposition process.

Next, a singulation operation may be performed on the structure shown in FIG. 6 to form one or more semiconductor package structures 2 shown in FIG. 2. In some embodiments, performing the singulation operation includes cutting through the protective material layer 300 and the shielding material layer 200 between the adjacent device packages 10.

FIGS. 7A and 7B illustrate one or more operations in a method of manufacturing a semiconductor package structure 1A in accordance with some embodiments of the present disclosure. In some embodiments, FIG. 7A illustrates a cross-sectional view along the x-z plane, and FIG. 7B illustrates a side view of the structure in FIG. 7A as viewed along the x-direction.

In some embodiments, a plurality of device packages 10 are provided on a carrier 530, and a shielding material layer 200 is formed on the device packages 10 and over the carrier 530. In some embodiments, the carrier 530 may include a tape or an adhesive layer.

In some embodiments, a portion of the device package 10 may be embedded in the carrier 530. In some embodiments, the connecting elements 40 and a portion of the redistribution layer 120 may be embedded in the carrier 530. In some embodiments, a portion E1a of an edge of the device package 10 (or the redistribution layer 120) is embedded in the carrier 530 and has an embedded depth (i.e., a length D1). In some embodiments, a portion E2a of an edge of the device package 10 (or the redistribution layer 120) is embedded in the carrier 530 and has an embedded depth (i.e., a length D2). In some embodiments, the device package 10 may be tilted along the x-direction, and thus the embedded depth (i.e., the length D1) of the embedded portion (i.e., the portion E1a) is different from the embedded depth (i.e., the length D2) of the embedded portion (i.e., the portion E2a).

In some embodiments, a portion E3a of an edge of the device package 10 (or the redistribution layer 120) is embedded in the carrier 530 and has an embedded depth (i.e., a length D3). In some embodiments, the device package 10 may be further tilted along the y-direction, and thus the embedded depth (i.e., the length DO of the embedded portion (i.e., the portion E1a) is different from the embedded depth (i.e., the length D3) of the embedded portion (i.e., the portion E3a). In some other embodiments, the device package 10 may not be tilted along the y-direction, and thus the embedded depth (i.e., the length D1) of the embedded portion (i.e., the portion E1a) may be substantially the same the embedded depth (i.e., the length D3) of the embedded portion (i.e., the portion E3a).

Next, a singulation operation may be performed on the structure shown in FIG. 7A to form one or more semiconductor package structures 1A shown in FIG. 1A.

According to some embodiments of the present disclosure, device packages are mass transferred to a carrier followed by forming a shielding material layer on the device packages on the same carrier, such that a picking and placing operation of the device packages prior to forming the shielding material layer can be omitted, and the shielding material layer can be formed uniformly on the device packages. Therefore, the manufacturing process is simplified, and the yield of the semiconductor package structures is increased. In addition, according to some embodiments of the present disclosure, the device packages are disposed on a carrier followed by expanding the carrier and then forming the shielding material layer on the device packages and the same carrier. Therefore, the distances between the device packages on the carrier prior to the expanding operation can be relatively small, and thus the substrate utilization can be relatively high, indicating a greater amount of the device packages can be disposed on the carrier.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
a device package; and
a shielding layer covering the device package and having an inclined bottom surface,
wherein the device package comprises:
an electronic device covered by the shielding layer;
an insulating layer disposed between the shielding layer and the electronic device and configured for avoiding undesirable current leakage between the shielding layer and the electronic device; and
an encapsulant covering the electronic device and contacting the insulating layer, wherein a lateral surface of the encapsulant substantially aligns with a lateral surface of the insulating layer.

2. The semiconductor package structure of claim 1, wherein an inner lateral surface of the shielding layer contacts the lateral surface of the insulating layer.

3. The semiconductor package structure of claim 1, wherein the inclined bottom surface of the shielding layer extends between a first edge and a second edge of the device package.

4. The semiconductor package structure of claim 3, wherein the device package has a first surface, a second surface opposite to the first surface, and a third surface extending between the first surface and the second surface, the second surface and the third surface define the first edge, and the first surface and the third surface define the second edge.

5. The semiconductor package structure of claim 4, wherein the shielding layer comprises a first portion covering the first surface of the device package and a second portion covering the second surface of the device package, and a vertical length of the first portion is greater than a vertical length of the second portion.

6. The semiconductor package structure of claim 1, wherein the device package comprises a surface and a grounding element exposed from the surface, and the shielding layer contacts the grounding element.

7. The semiconductor package structure of claim 1, wherein the device package has a top surface, a bottom surface opposite to the top surface, a first lateral surface extending between the top surface and the bottom surface, a second lateral surface opposite to the first lateral surface, a third lateral surface extending between the first lateral surface and the second lateral surface, and a fourth lateral surface opposite to the third lateral surface, the shielding layer covers the top surface, the first lateral surface, the second lateral surface, the third lateral surface, and the fourth lateral surface of the device package, and the bottom surface of the device package is exposed from the inclined bottom surface of the shielding layer.

8. A semiconductor package structure, comprising:
a device package having a first surface; and
a shielding layer covering the first surface of the device package,
wherein a portion of the first surface of the device package is exposed from the shielding layer and having a tapered shape,
wherein the shielding layer has a first lateral surface having a tapered shape; and
wherein the device package has a first edge and a second edge opposite to the first edge, the tapered shape of the portion of the first surface of the device package tapers toward the second edge, and the tapered shape of the first lateral surface of the shielding layer tapers toward the first edge.

9. The semiconductor package structure of claim 8, wherein the shielding layer further has a second lateral surface adjacent to the first lateral surface and having a tapered shape, and the tapered shape of the second lateral surface of the shielding layer tapers toward the second edge.

10. The semiconductor package structure of claim 8, wherein the device package further has a top surface, a bottom surface opposite to the top surface, a second surface extending between the top surface and the bottom surface, a third surface opposite to the second surface, and a fourth surface extending between the second surface and the third surface and opposite to the first surface, the shielding layer covers the top surface, the first surface, the second surface, the third surface, and the fourth surface of the device package, and the bottom surface of the device package is exposed from the shielding layer.

11. The semiconductor package structure of claim 8, wherein the device package comprises a redistribution layer at least partially covered by the shielding layer, and the redistribution layer comprises the portion of the first surface of the device package.

12. The semiconductor package structure of claim 11, wherein the redistribution layer comprises a grounding element extending toward the first surface of the device package and contacting the shielding layer.

13. The semiconductor package structure of claim 8, wherein the device package further has a second surface, and a portion of the second surface of the device package is exposed from the shielding layer and having a tapered shape.

14. A semiconductor package structure, comprising:
a device package having a first surface, a second surface opposite to the first surface, a third surface connecting the first surface to the second surface, and a fourth surface opposite to the third surface; and
a shielding layer covering the device package,
wherein a common edge of the first surface and the third surface comprises a first portion exposed from the shielding layer by a first length, and a common edge of the second surface and the fourth surface comprises a second portion exposed from the shielding layer by a second length that is different from the first length.

15. The semiconductor package structure of claim 14, wherein a common edge of the second surface and the third surface comprises a third portion exposed from the shielding layer by a third length that is different from the first length or the second length.

* * * * *